United States Patent
Bates et al.

(10) Patent No.: US 12,282,053 B1
(45) Date of Patent: Apr. 22, 2025

(54) HYBRID CIRCUIT BOARD

(71) Applicant: Cobham Advanced Electronic Solutions Inc., Arlington, VA (US)

(72) Inventors: Mark Bates, Lansdale, PA (US); James Edelen, Lansdale, PA (US); Robert Bauerle, Lansdale, PA (US); Michael Robert Ladd, Lansdale, PA (US); David L. Barrett, Lansdale, PA (US)

(73) Assignee: Cobham Advanced Electronic Solutions Inc., Arlington, VA (US)

( * ) Notice: Subject to any disclaimer, the term of this patent is extended or adjusted under 35 U.S.C. 154(b) by 240 days.

(21) Appl. No.: 18/045,299

(22) Filed: Oct. 10, 2022

(51) Int. Cl.
*G01R 31/28* (2006.01)
*H05K 1/02* (2006.01)
*H05K 3/10* (2006.01)
*H05K 3/32* (2006.01)

(52) U.S. Cl.
CPC ....... *G01R 31/2818* (2013.01); *H05K 1/0298* (2013.01); *H05K 3/103* (2013.01); *H05K 3/321* (2013.01)

(58) Field of Classification Search
CPC .. G01R 1/04; G01R 1/07328; G01R 31/2805; G01R 31/68; H05K 2201/09009
See application file for complete search history.

(56) References Cited

U.S. PATENT DOCUMENTS

| | | | |
|---|---|---|---|
| 4,833,396 A | 5/1989 | Haberland | |
| 5,202,623 A | 4/1993 | LePage | |
| 5,557,209 A | 9/1996 | Crook | |
| 5,821,758 A | 10/1998 | Jindal | |
| 6,119,536 A | 9/2000 | Popovic | |
| 6,630,832 B1 | 10/2003 | Harzanu | |
| 6,949,937 B2 | 9/2005 | Knoedgen | |
| 7,123,022 B2 | 10/2006 | Parker | |
| 2003/0133275 A1 | 7/2003 | Miyake | |
| 2005/0134292 A1 | 6/2005 | Knoedgen | |
| 2011/0115516 A1 | 5/2011 | Lee | |
| 2014/0338957 A1 | 11/2014 | Wang | |

FOREIGN PATENT DOCUMENTS

| | | | | |
|---|---|---|---|---|
| JP | 2005-127784 A | | 5/2005 | |
| KR | 20220004326 A | * | 1/2022 | ............ H05K 1/111 |
| WO | WO-2014197782 A1 | * | 12/2014 | ............... F21K 9/20 |

* cited by examiner

*Primary Examiner* — Tung X Nguyen
(74) *Attorney, Agent, or Firm* — Alston & Bird LLP

(57) ABSTRACT

Systems, apparatuses, semiconductor products and methods for circuit testing, specifically non-contact circuit testing are provided that allow for the wireless, non-contact testing of an electrical component. For example, non-contact circuit testing is performed using a non-contact testing apparatus that include a circuit cover with a conductive material and an oscilloscope. The circuit cover is places over an electrical component to form a parallel plate capacitor with electrical component. The parallel plate capacitor is formed with an air dielectric between the electrical component and the circuit cover. An electrical signal is initiated at the electrical component to cause a voltage through the parallel plate capacitor. An oscilloscope probe is used to measure the voltage of the parallel plate capacitor to determine a connectivity of the electrical component without contacting the electrical component.

18 Claims, 9 Drawing Sheets

HYBRID CIRCUIT BOARD

TECHNOLOGICAL FIELD

Example embodiments of the present invention relate generally to printed circuit boards, and more particularly to non-contact systems and methods for measuring continuity of electrical signals within circuit boards.

BACKGROUND

High performance integrated assemblies, including those addressing radio frequency (RF) applications, such as those in the aerospace or defense industry, can be expensive and time consuming to manufacture and/or test. When integrated with other system components such as, for example, an antenna circuit board, the performance of the assembly can rely heavily upon the electrical connectivity between the integrated components or assemblies. Connectivity can be supplied by circuit wires, traces, resistors, capacitors, inductors, etc. that allow a flow of electrical signals between integrated components. These connection components may be tested to ensure desired continuity performance between components. Prior solutions for testing the performance of electrical connection components include contacting a portion of the integrated circuit with a testing probe.

FIG. 1 illustrates an example of a contact testing configuration 100 of the prior art. FIG. 1 illustrates an integrated circuit assembly 105 disposed on an integrated system 110. The integrated circuit assembly 105 can include an integrated circuit 115 and one or more input/output pads 120. The integrated system 110 can include a printed circuit board (PCB) such as, for example, an antenna circuit board including a plurality of integrated circuit placement locations for placing integrated circuit assemblies 105.

Prior techniques for testing the electrical connection components between the integrated circuit 115 and the integrated system 110 include the use of touch probes 125 that make contact 130 with a testing portion of the integrated circuit assembly 105 to measure an electrical signal at the testing portion. The touch probe 125, for example, can be placed in contact with the input/output pads 120 of the integrated circuit assembly 105 to ensure that an electrical connection component (e.g., a circuit trace, surface mounting connection, etc.) of the integrated system 110 is supplying electrical signals to the integrated circuit assembly 105.

The contact testing configuration 100 includes testing the integrated circuit 115 after the integrated circuit 115 is electrically coupled to the integrated system 110. Integrated circuits 115 can be expensive and time consuming to create. Moreover, placement of the integrated circuit 115 with the integrated system 110 can be resource intensive. Therefore, it would be advantageous to test the electrical connection components of the integrated system 110 before electrically coupling the integrated circuit 115 to the integrated system 110.

Electrical connection components of the integrated system 110 can be small, hard to reach, and/or susceptible to damage or degradation by physical contact making conventional testing techniques such as the contact testing configuration 100 undesirable. For instance, making physical contact with an electrical connection component can cause surface degradation, including dimples, scratches, and the like, that can reduce the performance of the assembly. As one example, such degradations can prevent and/or reduce the reliability of wire bond attachments or result in undesirable surface coating permeability.

Through applied effort, ingenuity, and innovation, many of these identified problems have been solved by developing solutions that are included in embodiments of the present disclosure, many examples of which are described in detail herein.

BRIEF SUMMARY

Various embodiments described herein relate to systems, apparatuses, products, and methods for testing an electrical connection, including a non-contact testing solution for reaching test points that are small, hard to reach, and/or susceptible to degradation by physical contact.

In accordance with an example aspect of the present disclosure, a non-contact circuit testing apparatus is provided. The non-contact testing apparatus comprises a circuit cover comprising a conductive material. The circuit cover is configured to form a parallel plate capacitor with an electrical component of a circuit board. The non-contact testing apparatus comprises an oscilloscope probe configured to measure a voltage of the parallel plate capacitor.

In some embodiments, the non-contact circuit testing apparatus includes a spectrum analyzer configured to receive, as an output of the oscilloscope probe, a testing signal indicative of a presence of an electrical signal at the electrical component.

In some embodiments, the spectrum analyzer is configured to provide for display, based on the testing signal, an indication of the presence of the electrical signal at the electrical component.

In some embodiments, the oscilloscope probe is configured to amplify a voltage wave indicative of the voltage of the parallel plate capacitor to generate the testing signal.

In some embodiments, the circuit cover comprises a one-sided copper circuit board.

In some embodiments, the one-sided copper circuit board comprises an insulating side and a conductive side, and wherein the insulating side faces the electrical component.

In some embodiments, the conductive side forms a first plate of the parallel plate capacitor, and the electrical component forms a second plate of the parallel plate capacitor with an air dielectric between the first plate and the second plate.

In some embodiments, the oscilloscope probe comprises a high impedance scope probe.

In some embodiments, the circuit cover is removably placed over the electrical component of the circuit board.

In some embodiments, the circuit cover is separated from the electrical component of the circuit board by a threshold distance.

In some embodiments, the electrical component is a circuit trace of the circuit board for electrically coupling an integrated circuit to the circuit board.

In some embodiments, the circuit board comprises a multi-layered circuit board with a plurality of board layers. The circuit trace is disposed within a board pocket of the circuit board that is recessed within at least two of the plurality of board layers.

In some embodiments, the circuit cover is removably placed over the board pocket.

In some embodiments, the board pocket comprises a plurality of circuit traces, each disposed at a respective layer of the multi-layered circuit board.

In some embodiments, a connectivity of a respective circuit trace disposed at the respective layer of the multi-layered circuit board is tested by initiating an electrical signal through the respective circuit trace.

In some embodiments, the connectivity of at least two respective circuit traces of the plurality of circuit traces are tested simultaneously by: (i) initiating a first electrical signal at a first frequency through a first circuit trace, and (ii) initiating a second electrical signal at a second frequency through a second circuit trace, wherein the first frequency and the second frequency are different frequencies.

In some embodiments, a method for testing a connectivity of an electrical component on a circuit board is provided. The method comprises receiving, via a circuit cover placed over the electrical component, a voltage signal corresponding the electrical component. The circuit cover is separated from the electrical component by a dielectric. The method includes measuring, via an oscilloscope probe, the voltage signal. The method includes outputting, via the oscilloscope probe and based on the voltage signal, connectivity data indicative of the connectivity of the electrical component on the circuit board.

In some embodiments, the dielectric comprises air. The circuit cover is configured to form a parallel plate capacitor with the electrical component.

In some embodiments, the voltage signal is indicative of a voltage across the parallel plate capacitor.

In some embodiments, the method includes initiating an electrical signal through the electrical component and providing for display, via a spectrum analyzer, the connectivity data.

In some embodiments, the method includes determining, based on the connectivity data, an action for a portion of the circuit board. The action comprises at least one of: (i) a verification of the performance of the portion of the circuit board, (ii) a modification to an integrated circuit corresponding to the portion of the circuit board to compensate for the connectivity data; or (iii) a repair of the portion of the circuit board.

In some embodiments, the integrated circuit is a field programmable gate array (FPGA). The repair action comprises a modification to the performance of the FPGA.

In some embodiments, the method includes responsive to the repair action, initiating one or more firmware adjustments to firmware of the FPGA to modify the performance of the FPGA. The one or more firmware adjustments are associated with a mapping between one or more input/output bits of the FPGA and one or more circuit traces of the circuit board.

In some embodiments, the one or more firmware adjustments are based on the connectivity data and an anticipated frequency of use of the one or more input/output bits of the FPGA.

In some embodiments, the one or more input/output bits of the FPGA comprise one or more control bits for controlling a phase shift of an antenna. The one or more firmware adjustments comprise: (i) a first assignment of a first control bit to a first circuit trace with a high connectivity based on a high anticipated frequency of use of the first control bit, and (ii) a second assignment of a second control bit to a second circuit trace with a low connectivity based on a low anticipated frequency of use of the second control bit.

In some embodiments, a hybrid circuit board is provided. The hybrid circuit board includes a plurality of board layers comprising a plurality of conductive layers respectively separated by a plurality of insulating layers. The hybrid circuit board comprises a plurality of board pockets recessed within the plurality of board layers. A board pocket comprises a floor at a first intermediate board layer of the plurality of board layers. The hybrid circuit board comprises one or more electrical pocket devices disposed on the floor of the board pocket.

In some embodiments, the one or more electrical pocket devices comprise radio frequency (RF) circuitry.

In some embodiments, the hybrid circuit board comprises a plurality of surface-mount devices disposed on one or more top board layers of the plurality of board layers. The one or more top board layers are separated from the first intermediate board layer by one or more intermediate insulating layers of the plurality of insulating layers.

In some embodiments, the plurality of surface-mount devices comprise digital circuitry that is insulated from the RF circuitry by the one or more intermediate insulating layers.

In some embodiments, the hybrid circuit board comprises a pocket lid comprising an insulating material that is disposed over and at partially covers an opening of the board pocket at a surface layer of the plurality of board layers.

In some embodiments, the hybrid circuit board comprises one or more pocket shelves respectively disposed at an exterior edge of the board pocket. A pocket shelf is disposed at an intermediate board layer positioned between the first intermediate board layer and a surface layer of the plurality of board layers.

In some embodiments, the pocket shelf comprises one or more I/O board connectors for electrically coupling at least a portion of the one or more electrical pocket devices to the intermediate board layer.

In some embodiments, the one or more electrical pocket devices comprise one or more input/output (I/O) carrier components that are electrically coupled to the one or more I/O board connectors.

In some embodiments, the pocket shelf comprises a plurality of pocket circuit traces for electrically coupling the one or more electrical pocket devices to the intermediate board layer.

In some embodiments, the one or more electrical pocket devices comprise a die carrier assembly comprising one or more input/output (I/O) carrier components.

In some embodiments, the one or more I/O carrier components comprise one or more capacitive pads associated with one or more control bits of a surface mounted field programmable gate array (FPGA).

In some embodiments, the one or more control bits of the FPGA comprise one or more control bits for phase shifting or attenuation of an antenna.

In some embodiments, the one or more capacitive pads cover one or more voltage lines, bias lines, or RF lines of the die carrier assembly.

In some embodiments, the one or more capacitive pads are wire bonded to the plurality of pocket circuit traces to electrically couple the die carrier assembly to the intermediate board layer.

In some embodiments, the plurality of pocket circuit traces comprise one or more voltage or control lines of the intermediate board layer.

In some embodiments, an antenna controller apparatus that integrates digital control signals with radio frequency (RF) signals is provided. The antenna controller apparatus comprises a hybrid circuit board comprising: (i) a plurality of board layers comprising a plurality of conductive layers respectively separated by a plurality of insulating layers; and (ii) a plurality of board pockets recessed within the plurality of board layers. The board pocket comprises a floor at a first intermediate board layer of the plurality of board layers. The antenna controller apparatus comprises digital circuitry at least partially disposed at one or more surface layers of the hybrid circuit board. The antenna controller apparatus comprises RF circuitry at least partially disposed within the plurality of board pockets and electrically coupled to one or more intermediate board layers between the first intermediate board layer and the one or more surface layers of the hybrid circuit board.

In some embodiments, the hybrid circuit board is a receiver or a transmitter column associated with an antenna array system.

In some embodiments, a method of manufacturing a hybrid circuit board is provided. The method comprises forming a board pocket recessed within a plurality of board layers comprising a plurality of conductive layers respectively separated by a plurality of insulating layers. The method comprises affixing one or more electrical pocket devices to a floor of the board pocket. The method comprises electrically coupling the one or more electrical pocket devices to one or more intermediate board layers of the plurality of board layers.

In some embodiments, the one or more electrical pocket devices comprise a die carrier assembly comprising one or more capacitive pads. Electrically coupling the one or more electrical pocket devices to the one or more intermediate board layers of the plurality of board layers comprises wire-bonding the one or more capacitive pads to the one or more intermediate board layers of the plurality of board layers.

In some embodiments, the method comprises forming one or more pocket shelves at an exterior edge of the board pocket and an intermediate board layer positioned between the floor of the board pocket and a surface layer of the plurality of board layers; and wire-bonding the one or more capacitive pads to one or more circuit traces of the intermediate board layer.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those summarized here, some of which will be further described below.

BRIEF SUMMARY OF THE DRAWINGS

Figure 1:
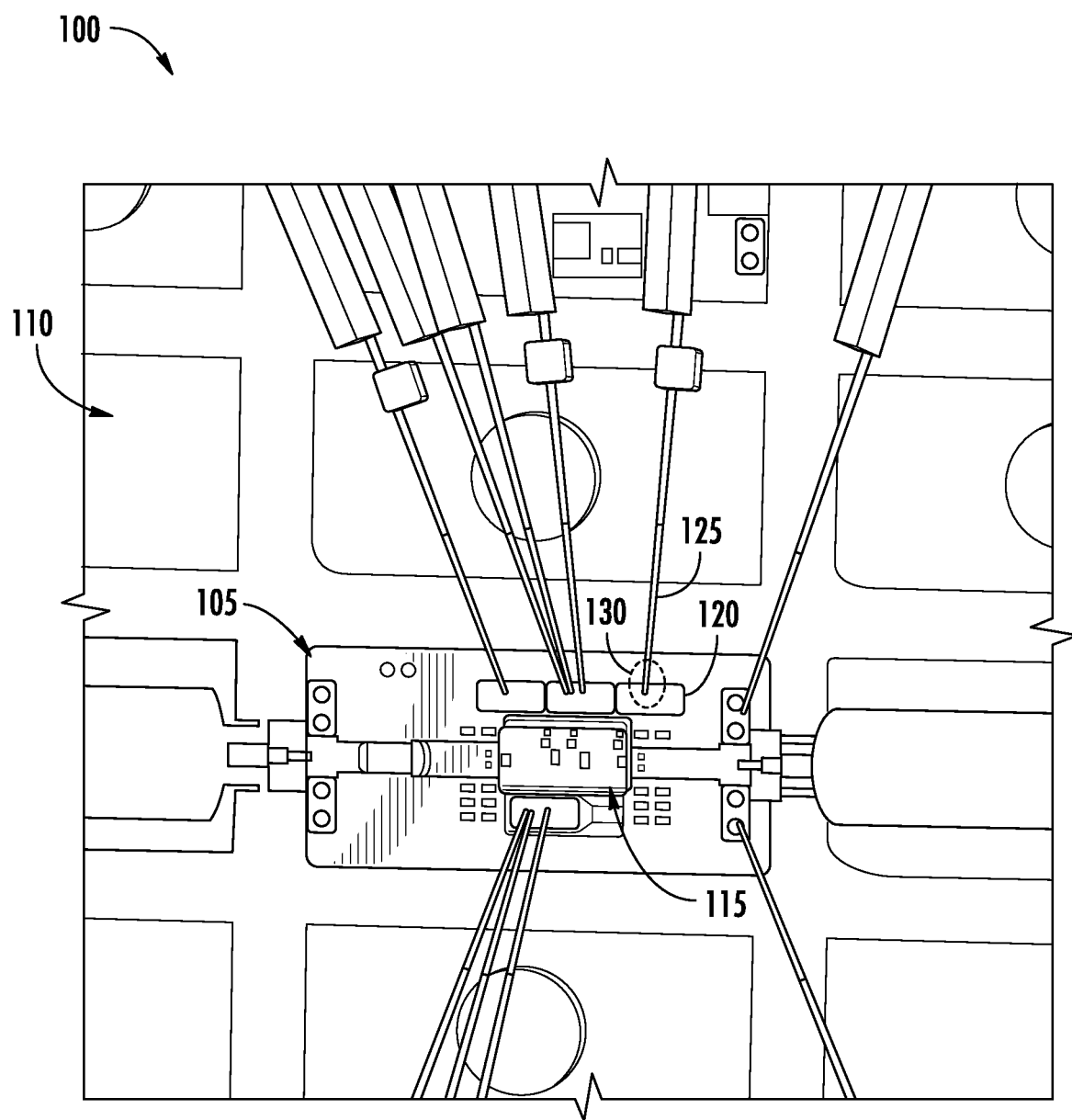
Figure 2:
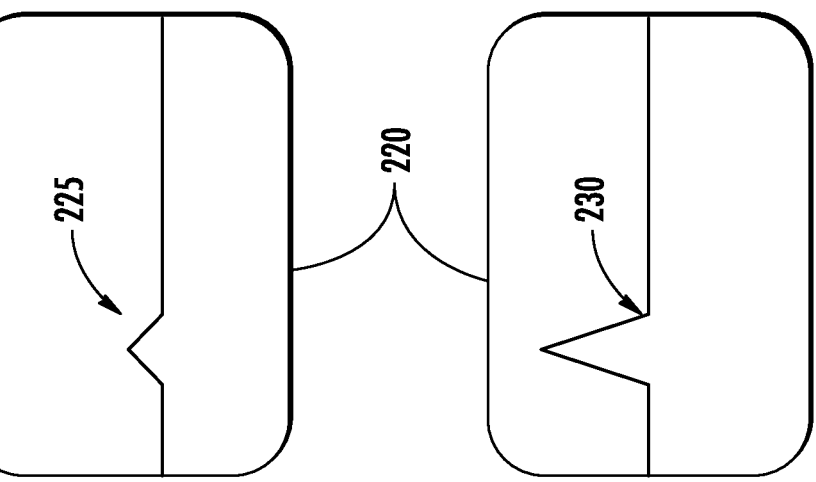
Figure 2:
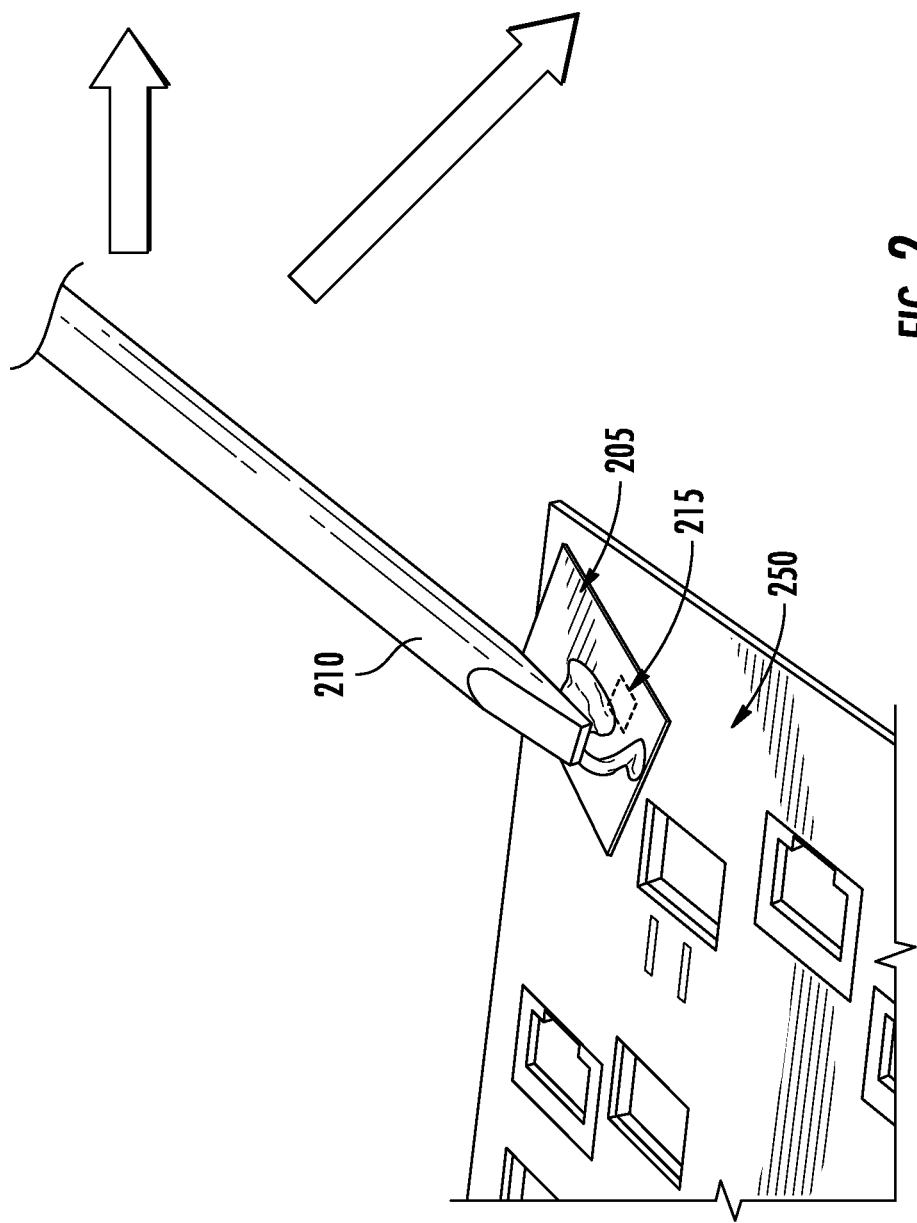
Figure 3A:
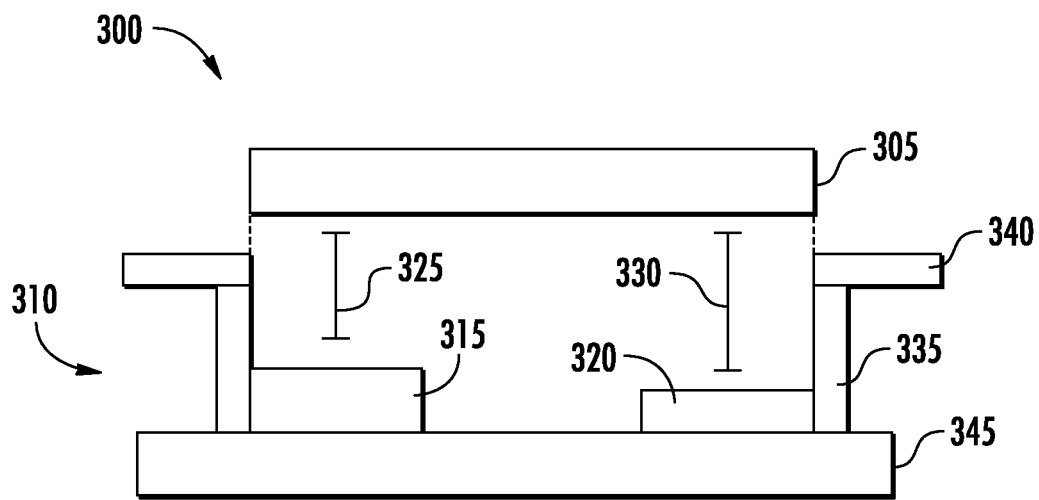
Figure 3B:
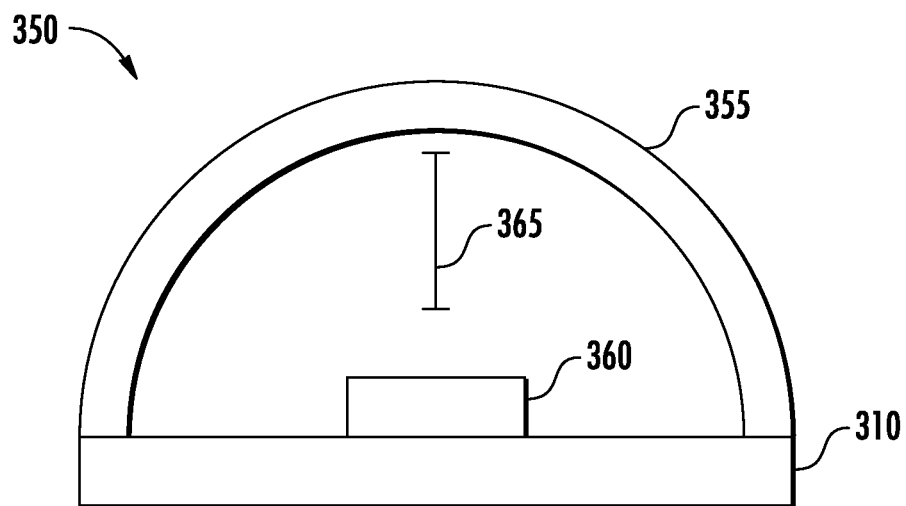
Figure 4:
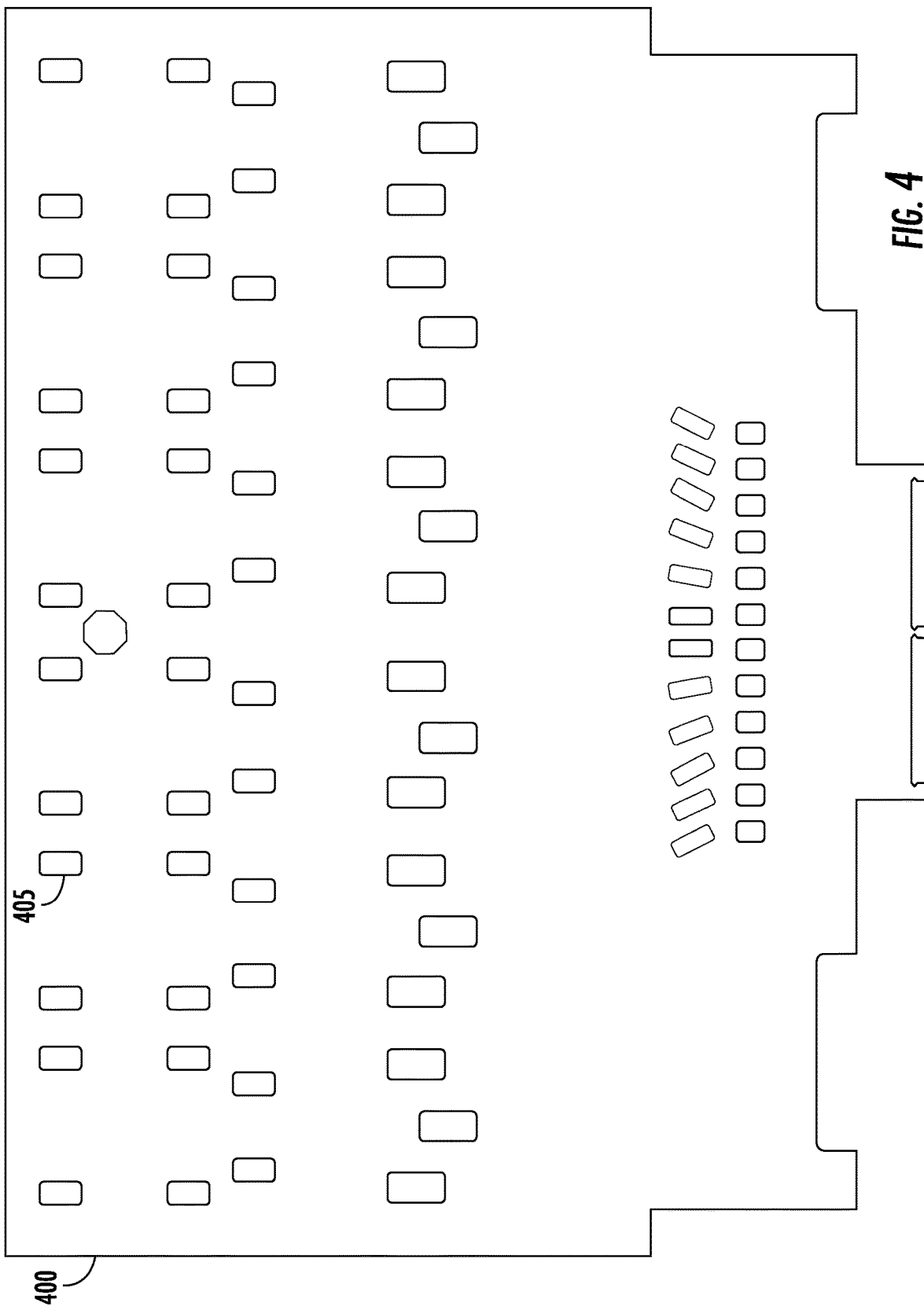
Figure 5:
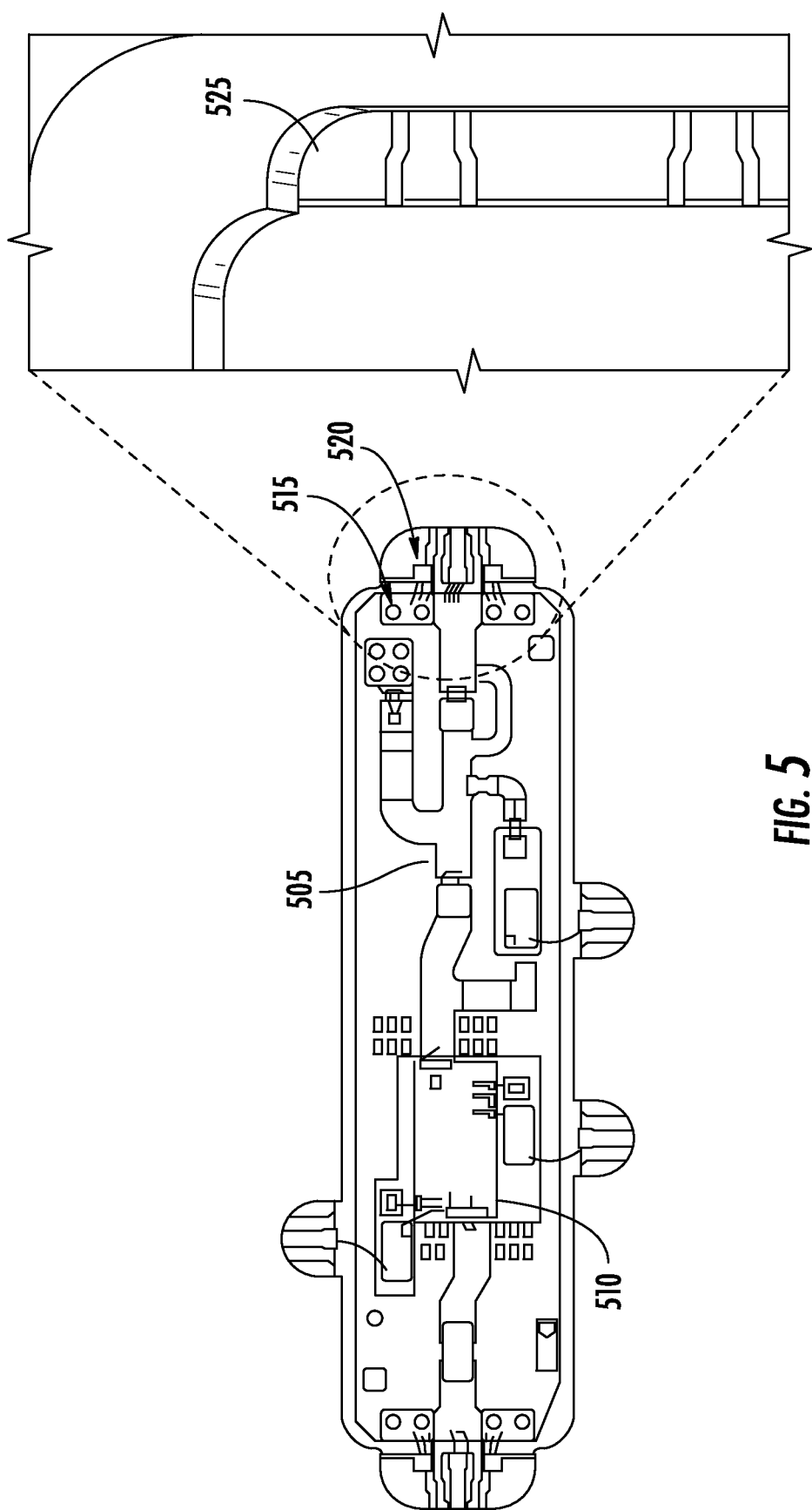
Figure 6:
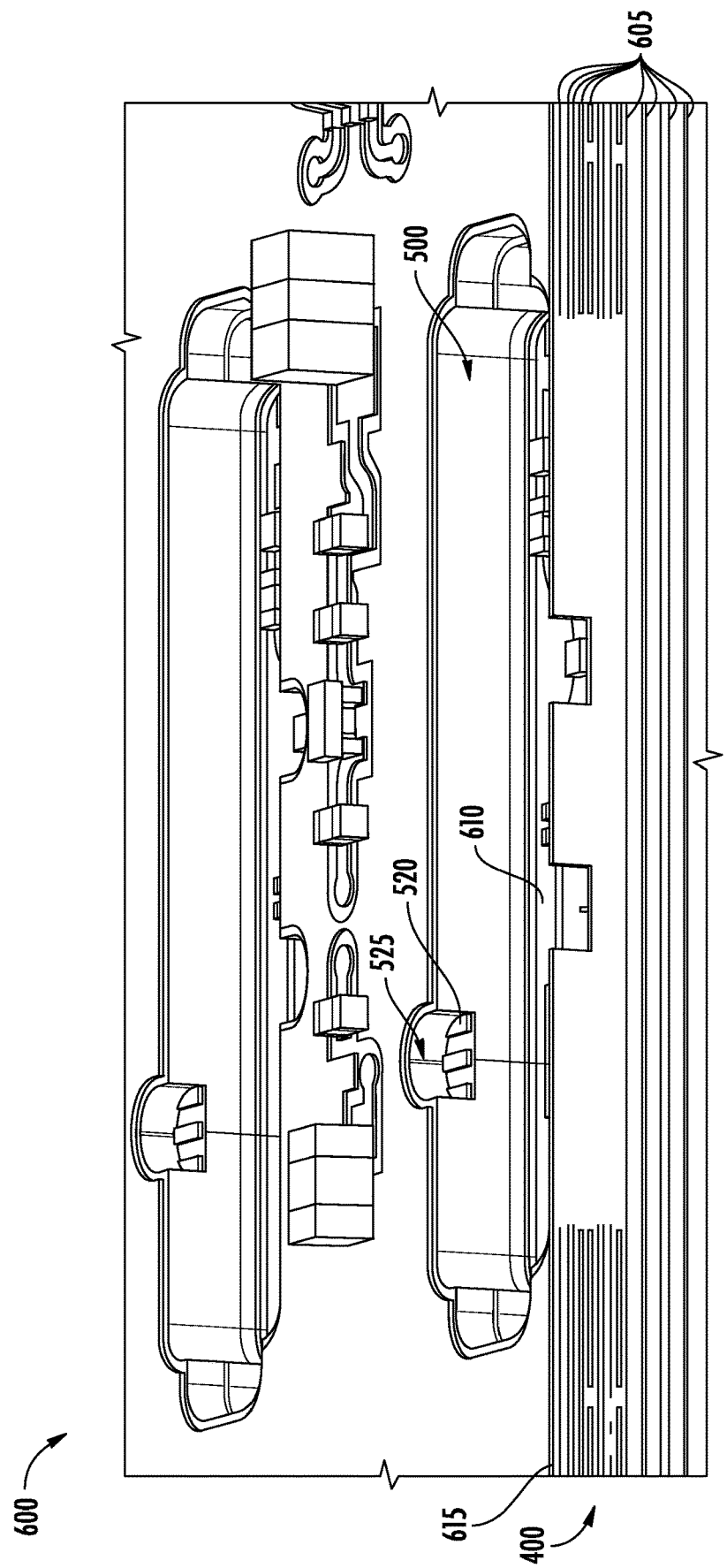
Figure 7:
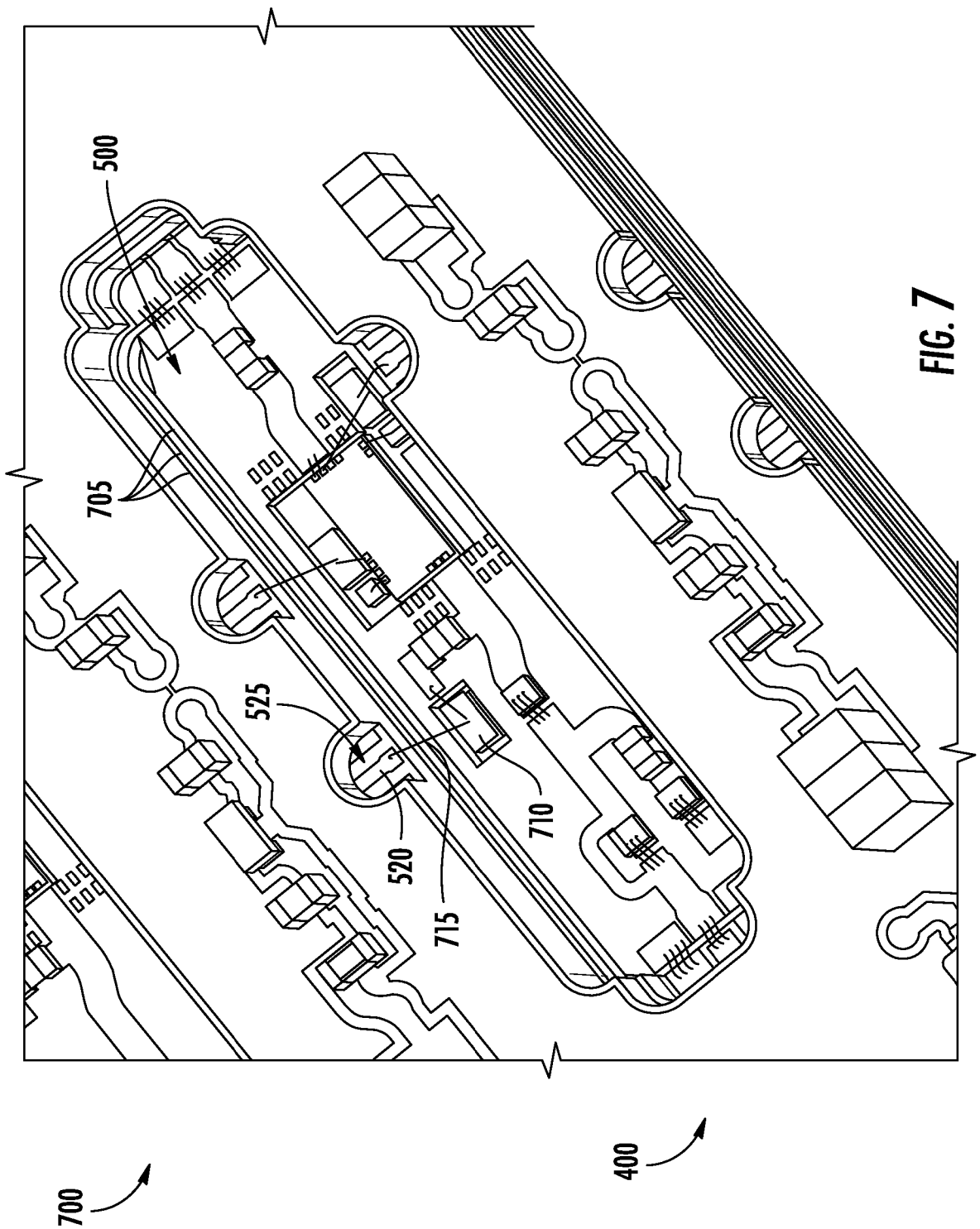
Figure 8:
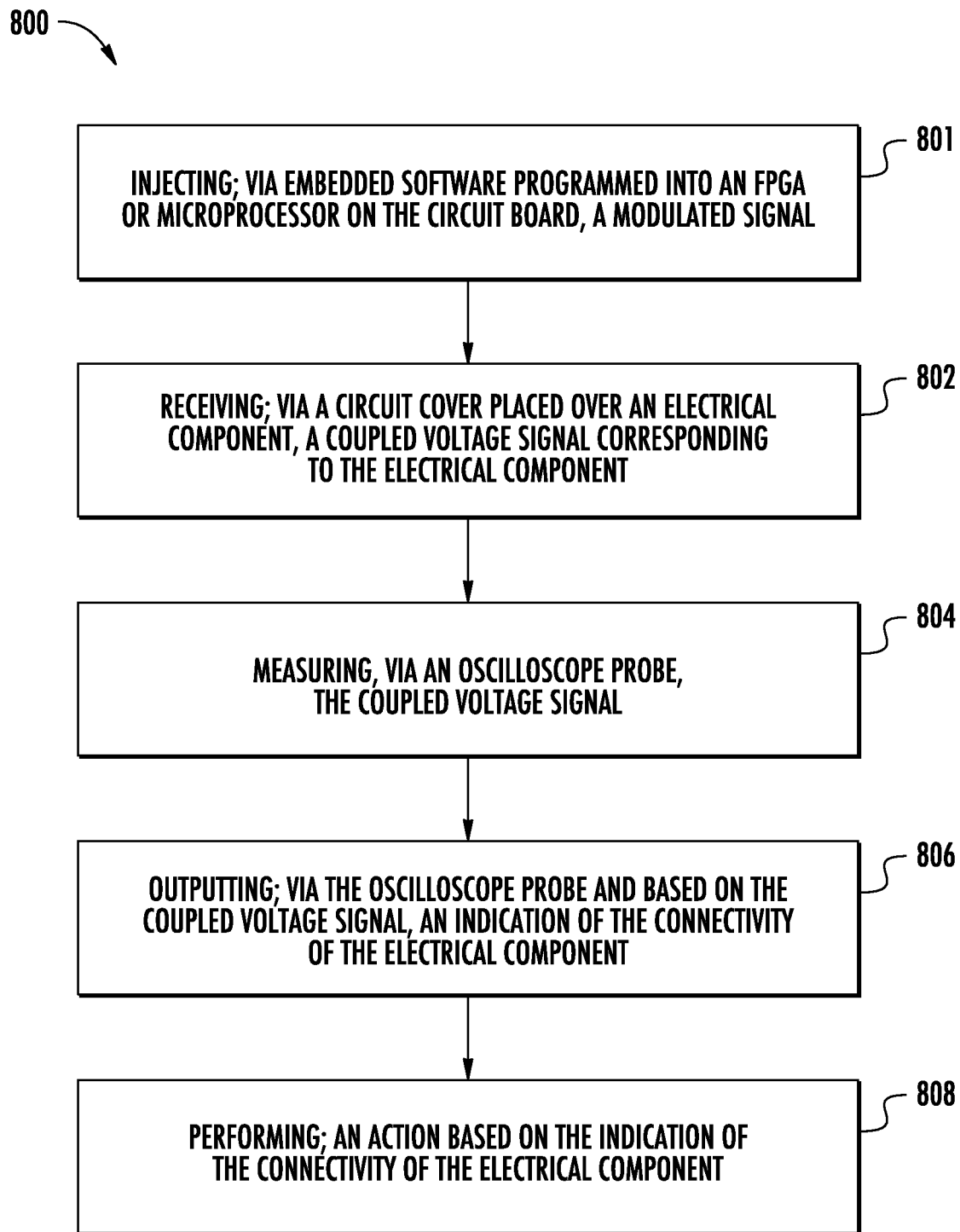
Figure 9:
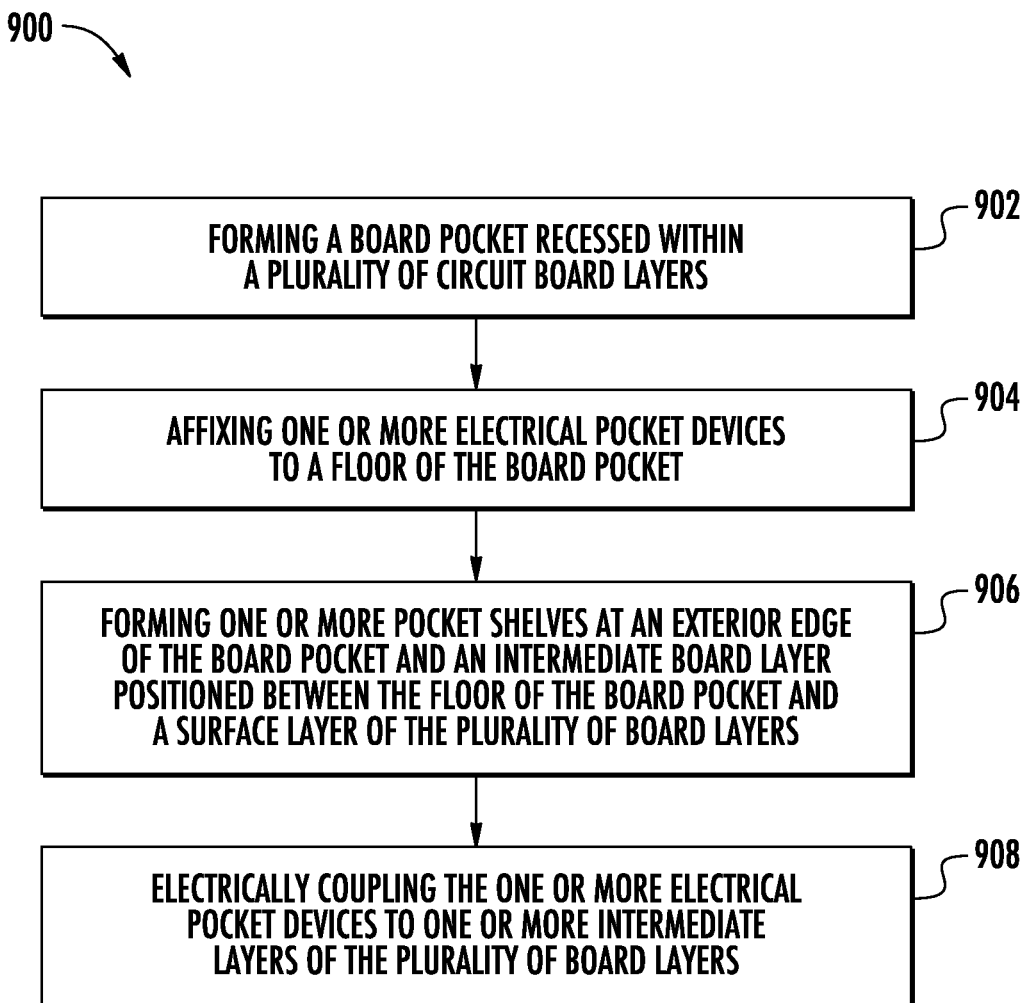

Having thus described certain example embodiments of the present disclosure in general terms, reference will now be made to the accompanying drawings, which are not necessarily drawn to scale, and wherein:

FIG. 1 illustrates an example of a prior art system for measuring an electrical signal;

FIG. 2 illustrates an example of a non-contact circuit testing apparatus for measuring an electrical signal in accordance with one or more embodiments of the present disclosure;

FIGS. 3A-B illustrate example non-contact circuit cover configurations in accordance with one or more embodiments of the present disclosure;

FIG. 4 illustrates an example of hybrid circuit board in accordance with one or more embodiments of the present disclosure;

FIG. 5 illustrates an example circuit board multi-layer pocket in accordance with one or more embodiments of the present disclosure;

FIG. 6 illustrates an example isometric view of the circuit board multi-layer pocket in accordance with one or more embodiments of the present disclosure;

FIG. 7 illustrates an example top view of the circuit board multi-layer pocket in accordance with one or more embodiments of the present disclosure;

FIG. 8 illustrates a flowchart according to an example method for testing one or more electrical components of a circuit board in accordance with one or more embodiments of the present disclosure; and FIG. 9 illustrates a flowchart according to an example method for initiating a repair action in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, aspects of the disclosure may be embodied in many different forms and should not be construed as limited to the embodiments set forth herein; rather, these embodiments are provided so that this disclosure will satisfy applicable legal requirements. Like reference numerals refer to like elements throughout.

Overview

Various embodiments of the present invention are directed to improved systems, apparatuses, products, and methods for testing an electrical connection. To overcome deficiencies with conventional electrical testing techniques, the present disclosure provides for a non-contact testing solution reaching test points that are small, hard to reach, and/or may be susceptible to degradation by physical contact. The non-contact testing solution includes a non-contact circuit testing apparatus. The non-contact circuit testing apparatus includes a circuit cover and an oscilloscope or sensor probe. The circuit cover includes a conductive material that, when placed in close proximity to an electrical connection component such as a circuit trace of a PCB, produces a capacitive coupling effect with the electrical connection component. In the simplest terms, a parallel plate capacitor is formed with two conductive layers separated by an insulating gap. A first plate of the parallel plate capacitor includes the conductive material of the circuit cover, a second plate includes the electrical connection component, and the insulating gap includes an air dielectric between the first and second plate. The oscilloscope probe is used to measure a time-varying signal on the parallel plate capacitor to test the connectivity of the electrical connection component. The oscilloscope probe can amplify the electrical signal to a spectrum analyzer that can indicate the presence of the electrical signal.

In this manner, the present disclosure provides a novel technique for testing whether electrical signals are reaching their desired destinations in an integrated system such as a PCB. Advantageously, the described technique allows testing to be performed before a circuit is fully populated, which saves time and resources by reducing the need for disassembling the integrated system due to poor testing results. Moreover, by utilizing a non-contact circuit testing apparatus for measuring the presence of electrical signals, the present disclosure provides a novel testing apparatus that can test for appropriate connections at points that are difficult to physically reach or touch. By modulating the electrical signals and then radiating those signals so that they can be picked up by an antenna scope such as the oscilloscope probe, the non-contact circuit testing apparatus provides a safer testing solution that can reduce physical deformations to electrical connection components due to physical contact.

The non-contact testing techniques described herein can be utilized for testing any electrical connection and can be especially useful when testing high-density circuit boards. In some embodiments, the non-contact testing techniques can be utilized to test novel printed circuit board designs such as, for example, a hybrid circuit board that integrates control and radio frequency (RF) signals into one board.

In conventional circuit board systems, integrating digital and radio frequency circuitry can reduce performance of the system due, in part, to impedance factors that can impact radio frequency traces. To overcome these deficiencies, conventional systems integrate radio frequency circuitry in separate boards that mount on or connect with a digital circuit board. In this manner, the radio frequency circuitry can be insulated from the digital circuitry to allow lower board costs. This approach can lead to larger assemblies, reduced system performance, limited functionality, and can be susceptible to incompatibility drawbacks.

The present disclosure provides for a hybrid solution for printed circuit boards, which include a combination of digital circuitry integrated with radio frequency circuitry. The hybrid circuit board includes a multi-layer board (e.g., over a dozen layers, etc.). The multi-layer board includes a plurality of board pockets recessed within one or more of the pluralities of board layers. A board pocket, for example, can include a cut out of the one or more board layers at a portion of the hybrid circuit board. An integrated circuit assembly including RF circuitry can be placed within a board pocket to insulate the RF circuitry from digital circuitry of the hybrid circuit board.

The plurality of board layers includes a plurality of conductive layers and a plurality of insulating layers. The plurality of insulating layers can insulate radio frequency traces from digital traces allowing each respective trace to operate without interference. For example, the integrated circuit assembly can include a field programmable gate array (FPGA) with control lines to one or more radio frequency devices. The radio frequency traces can be insulated from the digital control lines of the hybrid circuit board by one or more insulating layers between a floor of a respective board pocket and a surface of the hybrid circuit board. An integrated circuit assembly placed within a board pocket can be wire bonded to one or more conductive layers of the hybrid circuit board to allow for electrical communication between one or more other components of the hybrid circuit board. Insulating lids can placed over the board pockets to further insulate the board components in the board pocket from surface mounted components of the hybrid circuit board. In this manner, the hybrid circuit board can insulate radio frequency circuitry from digital circuitry, while enabling communication between the circuitry in a single circuit board design.

The performance of the hybrid circuit board can be evaluated based on a plurality of factors including, for example, throughput efficiency, total power efficiency, signal integrity, channel-to-channel coupling, board-to-board coupling, etc. Conventional techniques for testing circuit boards are done after the fabrication of the board. Circuit board configurations can be expensive, time-consuming, and difficult to fabricate, which can be especially true for multi-layered, high density circuit boards, such as hybrid circuit boards described herein. To address drawbacks with conventional testing techniques, the present disclosure presents a novel simulation process for simulating the performance of the hybrid circuit board using a virtual board representation. The virtual board representation combines aspects of board design, geometrical board features, and electrical connection features to provide a holistic view of the performance of the hybrid circuit board before fabrication. By combining design, geometrical, and electrical features into one virtual board representation, the present disclosure enables the assessment of nuanced board features such as, for example, channel-to-channel and/or board-to-board isolation that can inform iterative redesigns to increase first-build success rates for complex circuit boards.

It should be readily appreciated that the embodiments of the systems, apparatus, and methods described herein may be configured in various additional and alternative manners in addition to those expressly described herein.

Non-Contact Testing Apparatus

FIG. 2 illustrates an example non-contact testing apparatus 200 for measuring an electrical signal in accordance with one or more embodiments of the present disclosure. The non-contact testing apparatus 200 can include a circuit cover 205 and an oscilloscope probe 210. The circuit cover 205 can be placed over an electrical component 215 on a hybrid circuit board 250 to measure an electrical signal associated with the electrical component 215. Connectivity data indicative of the electrical signal can be provided for display through a display device 220 communicatively coupled to the circuit cover 205, the electrical component 215, and/or the oscilloscope probe 210. The connectivity data can indicate a presence of an electrical signal associated with the electrical component 215. A low energy signal 225 can indicate a low connectivity of the electrical component 215. A high energy signal 230 can indicate a high connectivity of the electrical component 215.

The electrical component 215 can include an electrical connection component of a printed circuit board (PCB). The electrical connection component, for example, can include a circuit wire, circuit trace, surface mount, and/or any other component for electrically coupling two electrical devices and/or receive, generate, or carry electrical signals. The electrical component 215, for example, can include a circuit trace (e.g., a digital circuit trace, a radio frequency circuit trace, etc.). The circuit trace can be associated with a circuit such as, for example, an integrated circuit (e.g., a field programmable gate array, etc.). The circuit trace, for example, can include a circuit trace of a PCB that is configured to allow current to flow to and/or from an integrated circuit electrically coupled to the PCB. In some embodiments, the circuit trace can be wire bonded to one or more input/output components associated with the integrated circuit.

The electrical component 215 can include a small and/or fragile material that can be difficult to physically contact and/or can be susceptible to damage if physically contacted. For example, the electrical component 215 can include a small circuit trace that can include millimeter dimensions. In some embodiments, the small circuit trace can include a material that is subject to damages such as scratches or dimples due to physical interactions. These damages can reduce the efficacy of the electrical components 215 for coupling (e.g., through wire bonding, etc.) electrical devices.

In addition, or alternatively, the electrical component 215 can be positioned in an area that is difficult to reach with a physical instrument. By way of example, the electrical component 215 can be included in a single layered and/or multi-layered PCB. The PCB can include a plurality of electrical components, including the electrical component 215, disposed at various positions and/or layers of the PCB. In some embodiments, the electrical component 215 can be positioned in a gap of the PCB and/or be otherwise covered by another component of the PCB. By way of example, the electrical component 215 can be recessed within a board pocket of a multi-layer PCB with limited accessibility.

The non-contact testing apparatus 200 provides a non-contact testing solution for testing electrical components comprising a small and/or fragile material and/or located in inaccessible areas. As described herein, the non-contact testing apparatus 200 can be utilized for testing electrical connectivity of the electrical component 215 without making physical contact with the electrical component 215. In this manner, the non-contact testing apparatus 200 can be used to measure an electrical connectivity of a small, fragile, and/or hard to reach circuit trace (and/or any other electrical connection component) before the circuit trace is used to couple (e.g., through wire bonding, etc.) an integrated circuit with a PCB.

The non-contact testing apparatus 200 includes a circuit cover 205. The circuit cover 205 can be placed over the electrical component 215 to help measure an electrical connectivity of the electrical component 215. The circuit cover 205 can be placed over the electrical component 215 to at least partially cover the electrical component 215. In some embodiments, the circuit cover 205 can be removably placed at a position over the electrical component 215. In some embodiments, the circuit cover 205 can be affixed to a position over the electrical component 215. By way of example, the electrical component 215 can include a circuit trace of a PCB and the circuit cover can be affixed at a position of the PCB that is above the circuit trace.

The circuit cover 205 includes a conductive material that can be removably placed (and/or fixed) within a proximity of the electrical component 215. The circuit cover 205, for example, can include a copper material. In some embodiments, the circuit cover 205 can include a testing circuit board with one or more conductive and/or insulating layers. The circuit cover 205, for instance, can include a one-sided copper circuit board. The one-sided circuit board can include an insulating side and a conductive side. In some embodiments, the circuit board can be placed over the electrical component 215 with the insulating side facing the electrical component 215 and/or the conductive side facing away from the electrical component 215.

The circuit cover 205 can be implemented in one or more different cover dimensions. In some embodiments, the cover dimensions can be based on the electrical component 215 (e.g., a size, positioning, etc. thereof) and/or a testing scenario for the electrical component 215. For instance, in some embodiments, the circuit cover 205 can be configured to cover a portion of a PCB that includes the electrical component 215. The portion of the PCB can include a board pocket recessed within the PCB. The circuit cover 205 can include cover dimensions that are based on the dimensions of the board pocket. By way of example, the board pocket can include first pocket dimensions (e.g., a third of an inch by a half of an inch, etc.) and the circuit cover 205 can include a square piece of testing circuit board with second cover dimensions (e.g., one inch by a third of an inch, etc.) for completely (and/or partially) covering the board pocket.

The circuit cover 205 can be placed within a proximity of the electrical component 215 to form a parallel plate capacitor. For instance, the circuit cover 205 can be configured to form a parallel plate capacitor with the electrical component 215. The parallel plate capacitor, for example, can be formed by the electrical component 215 and the conductive material of the circuit cover 205. A dielectric between the electrical component 215 and the circuit cover 205 can include an insulating layer of the circuit cover 205 and/or the air between the electrical component 215 and the circuit cover 205.

The circuit cover 205 can include a testing circuit board with a conductive structure in the form of an antenna circuit. The circuit cover 205 can be placed a distance above/from the electrical component 215 such as a circuit trace (e.g., on top of the pocket within which the circuit trace is placed, etc.) to form an electrical connection between the antenna circuit and the circuit trace. The antenna circuit can be utilized to form a first side of a parallel plate capacitor and the circuit trace can be utilized to form a second side of the parallel plate capacitor separated from the conductive side of the circuit cover 205 by an air dielectric and/or an insulating structure of the circuit cover 205. A radiated signal can be generated and measured using the parallel plate capacitor without making direct contact with the circuit trace.

FIGS. 3A-B illustrate example non-contact circuit cover configurations in accordance with one or more embodiments of the present disclosure. FIG. 3A depicts a first example circuit cover configuration 300. FIG. 3B depicts a second example circuit cover embodiment 350.

In the first example circuit cover configuration 300, the circuit cover 305 can include a flat cover that is configured to be positioned a threshold distance from one or more electrical components of a PCB 310. The electrical components, for example, can include a first electrical component 315 and a second electrical component 320. The electrical components can be recessed within a pocket of the PCB 310. The pocket of the PCB 310, for example, can be formed by sidewalls 335 that extend from a top board layer 340 of the PCB 310, within the PCB 310, to a bottom board layer 345 of the pocket.

The electrical components can be positioned the same threshold distance from the circuit cover 305. In addition, or alternatively, the electrical components can be positioned at different threshold distances from the circuit cover 305.

For instance, the electrical components can be positioned at one or more different distances from a top board layer of the PCB 310. For example, the electrical components can be positioned at different layers of the PCB 310. By way of example, the first electrical component 315 can be positioned at a first layer that is a first threshold distance 325 from the top board layer of the PCB 310. The second electrical component 320 can be positioned at a second layer that is a second threshold distance 330 from the top board layer of the PCB 310. As described herein, each electrical component can be positioned on a respective shelve formed by the side walls 335.

The circuit cover 305 can be placed at or near the top board layer 340 of the PCB 310 such that the circuit cover 305 is separated from the electrical components of the PCB 310 by a threshold distance. By way of example, the circuit cover 305 can be separated from the first electrical component by the first threshold distance 325 and from the second electrical component 320 by the second threshold distance 330. In this manner, the circuit cover 305 can form a parallel plate capacitor with both the first electrical component 315 and the second electrical component 320 without making direct contact with either component. The connectivity of each electrical component can be tested individually by transmitting an electrical signal through the respective electrical connection component.

FIG. 3A illustrates one example circuit cover configuration 300. Any number of alternative configurations may be appropriate depending on the testing parameters for an integrated assembly. The circuit cover 305, for example, can include any form or shape and may not be flat as long as it is in close proximity to an electrical component and includes a conducting material.

By way of example, in the second example circuit cover configuration 350, the circuit cover 355 can include a curved cover that is configured to be positioned a third threshold distance 365 from a third electrical component 360 of the PCB 310. The curved cover can be configured to partially and/or completely cover the third electrical component 360 without making direct physical contact with the third electrical component 360. The curved cover, for example, can be separated from the third electrical component 360 by the third threshold distance 365. The curved cover can form a coupled capacitor effect with the third electrical component 360 without making direct contact with the component. In this manner, the connectivity of a third electrical component 360 that is positioned on a top board layer of the PCB 310 can be tested without making direct contact with the third electrical component 360.

Turning back to FIG. 2, a radiated signal generated using capacitive coupling (herein referred to as a parallel plate capacitor) can be measured using the oscilloscope probe 210. The oscilloscope probe 210 can include a high impedance scope probe that can measure the voltage across a gap between the electrical component 215 and the circuit cover 205. The scope probe can be used to amplify the voltage measurements for use with a spectrum analyzer. The spectrum analyzer can include a display device 220 that can output connectivity data indicative of the voltage measurement in one or more data formats (e.g., in a time domain, frequency domain, etc.).

The oscilloscope probe 210 includes a test probe that is configured to measure an electrical signal (e.g., a voltage, etc.) obtained through capacitive coupling to determine the presence (and/or characteristics thereof) of an electrical signal at the electrical component 215. The oscilloscope probe 210 can include a probe tip, an extender, an insulated body, and/or a cable electrically coupling the oscilloscope probe 210 to an end terminal. The end terminal can include an oscilloscope and/or a spectrum analyzer. In some embodiments, the oscilloscope probe 210 can be configured to amplify the electrical signal of the parallel plate capacitor to increase the detectability of the electrical signal at the electrical component 215.

An electrical signal can be supplied to the electrical component 215 to test the connectivity of the electrical component 215. The electrical signal, for example, can include an electromagnetic wave including a threshold frequency. The threshold frequency can be based on the electrical component 215. By way of example, in some embodiments, the threshold frequency can include a fifty-megahertz frequency for a circuit trace of a PCB. The electrical signal can cause a voltage across the parallel plate capacitor. The voltage can be detected and amplified by the oscilloscope probe 210 and provided to an oscilloscope and/or spectrum analyzer for analysis.

A spectrum analyzer, for example, can be configured to receive, as an output of the oscilloscope probe 210, a testing signal indicative of the presence of the electrical signal at the electrical component 215. The testing signal can be an amplified signal indicative of the voltage across the parallel plate capacitor. The spectrum analyzer can be configured to provide for display, based on the testing signal, connectivity data indicative of the presence of the electrical signal at the electrical component 215. The connectivity data can include a representation of the testing signal in a time or frequency domain. A high energy signal 230 (e.g., indicative of a high electrical output) can be used to verify the connectivity of the electrical component 215. A low energy signal 225 (e.g., indicative of a poor electrical output) can be used to identify potential low connectivity of the electrical component 215.

In some implementations, a high energy signal 230 can include a signal that achieves a threshold signal strength. A low energy signal 225 can include a signal that does not achieve a threshold signal strength. Alternatively, different high and low thresholds for signal strength may be applied, rather than a single threshold. The threshold signal strength(s) can be based on the electrical component 215, a testing scenario, and/or one or more functionalities of the electrical component 215 or one more associated components such as, for example, an associated circuit, PCB, etc. In some embodiments, the threshold signal strength(s) can be based on historical testing data indicative of the historical performance of the electrical component 215, one or more similar electrical components, and/or one or more associated components (e.g., an associated integrated circuit, a PCB, etc.).

Hybrid Circuit Board

FIG. 4 illustrates an example hybrid circuit board 400 in accordance with one or more embodiments of the present disclosure. The hybrid circuit board 400 includes a multi-layered circuit board with integrated digital and radio frequency components. The hybrid circuit board 400, for example, can integrate digital control components (e.g., for digital beamforming, etc.) for an antenna array with radio frequency components such as, for example, the radio frequency front ends, back ends, etc. of the antenna array. In this manner, the hybrid circuit board 400 can integrate radio frequency and digital control into one integrated PCB. As one example, the hybrid circuit board 400 can be implemented in an antenna controller apparatus that integrates digital control signals with RF signals. The antenna controller apparatus can include digital circuitry at least partially disposed at one or more surface layers of the hybrid circuit board 400 and RF circuitry at least partially disposed within a plurality of board pockets of the hybrid circuit board 400 that are insulated from the one or more surface layers of the hybrid circuit board 400.

In conventional circuit board systems, integrating digital and radio frequency circuitry can reduce performance of the system due, in part, to impedance factors that can impact radio frequency traces. To overcome these deficiencies, conventional systems integrate radio frequency circuitry in separate board that mount on or connect with a digital circuit board. In this manner, the radio frequency circuitry can be insulated from the digital circuitry of the digital circuit board. Conventional approaches can lead to larger assemblies, reduced system performance, limited functionality, and can be susceptible to incompatibility drawbacks. To overcome limitations with the conventional systems, the hybrid circuit board 400 can include a plurality of board pockets 405 built into a single sided, multi-layered, circuit board than can insulate radio frequency circuitry from digital circuitry in a single board design. In this manner, the hybrid circuit board 400 presents a new circuit board design capable of combining surface digital control technology with microwave hybrid components into a single PCB.

The hybrid circuit board 400 can be implemented in one or more different dimensions based on the application. In one example embodiment, the hybrid circuit board 400 can include several beamforming functions. The hybrid circuit board 400, for example, can include a receiver and/or transmitter column associated with an antenna array system.

The hybrid circuit board 400 can include a plurality of board layers. The plurality of board layers include a plurality of conductive layers and a plurality of insulating layers. The plurality of conductive layers can be respectively separated by the plurality of insulating layers. The plurality of board layers can include one or more top board layers including a surface layer and a plurality of intermediate board layers positioned below the one or more top board layers.

The hybrid circuit board 400 can include a plurality of surface mounts at one or more top board layers for mounting a plurality of surface-mount devices to the hybrid circuit board 400. The hybrid circuit board 400 can include a plurality of surface-mount devices disposed on one or more top board layers of the plurality of board layers. In addition, or alternatively, the hybrid circuit board 400 can include a plurality of board pockets 405 recessed within the plurality of board layers of the hybrid circuit board 400. The number of the plurality of board pockets 405 can be based on the application. The hybrid circuit board 400 can include any range of board pockets 405 including fifty, one hundred, etc.

Each board pocket 405 can include one or more electrical pocket devices disposed within the board pocket 405. For example, each board pocket 405 can include a floor at a first intermediate board layer of the plurality of intermediate board layers. The one or more electrical pocket devices can be disposed on the floor of the board pocket.

The electrical pocket devices can be insulated from the one or more top board layers of the hybrid circuit board 400 and electrically coupled to one or more of the plurality of intermediate board layers of the hybrid circuit board 400. For example, one or more top board layers can be separated from the first intermediate board layer by one or more intermediate insulating layers of the plurality of insulating layers. One or more portions of the electrical pocket devices can be wire bonded to one or more of the plurality of intermediate board layers to selectively couple the electrical pocket devices to one or more first portions of the hybrid circuit board 400 while insulating the electrical pocket devices from one or more second portion to of the hybrid circuit board 400.

For instance, the one or more electrical pocket devices can include radio frequency (RF) circuitry. The plurality of surface-mount devices can include digital circuitry that is insulated from the RF circuitry by the one or more intermediate insulating layers. In some implementations, the hybrid circuit board 400 can include a plurality of pocket lids disposed over the plurality of board pockets 405. A pocket lid can include an insulating material that is disposed over and at partially covers an opening of a board pocket at a surface layer of the plurality of board layers. For instance, each board pocket 405 can be covered by a pocket lid. The pocket lid can include an insulating material that can insulate the plurality of surface-mount devices from the electrical pocket devices.

The one or more electrical pocket devices can include an integrated circuit. As one example, the one or more electrical pocket devices can include a die carrier assembly. The die carrier assembly can include one or more input/output (I/O) components. The one or more I/O components can include I/O pads that can be wire bonded to one or more intermediate board layers of the hybrid circuit board 400 to enable communication between an FPGA or microprocessor and one or more other components of the hybrid circuit board 400.

FIG. 5 illustrates an example board pocket device 505 in accordance with one or more embodiments of the present disclosure. The board pocket 405 (shown in FIG. 4) can include an electrical pocket device 505. The electrical pocket device 505 can include a die carrier assembly. The die carrier assembly can include a die 510. The die 510 can be an RF amplifier or other integrated circuit. The electrical pocket device 505 can be electrically coupled to the hybrid circuit board by wire bonding I/O carrier connectors 515 of the die carrier assembly to one or more I/O board connectors of the hybrid circuit board 400 (shown in FIG. 4). The I/O board connectors 520 of the hybrid circuit board 400 can include circuit traces disposed on a pocket shelf of the board pocket 405. The circuit traces, for example, can include one or more voltage and/or control lines. The I/O board connectors 520 can be associated with one or more control bits (e.g., six, etc.), that can be used to provide instructions and/or receive data from the electrical pocket device 505.

The I/O board connectors 520 can be respectively positioned on one or more pocket shelves 525 recessed within the hybrid circuit board 400. Each pocket shelf 525 can correspond to a particular layer of the hybrid circuit board 400. For instance, a first pocket shelf can include a cut out from the hybrid circuit board 400 that allows the die carrier assembly to be electrically coupled to a particular layer (and/or one or more components thereof) of the hybrid circuit board 400. In this manner, an integrated circuit can be installed within an insulated pocket of the hybrid circuit board 400 and selectively wire bonded to particular portions of the hybrid circuit board 400. This provides an improvement to traditional circuit board designs by combining surface-mount devices with electrical pocket devices 505 embedded and insulated from the surface-mount devices of the PCB.

FIG. 6 illustrates an example side view 600 of a portion of the hybrid circuit board 400 in accordance with one or more embodiments of the present disclosure. The hybrid circuit board 400 includes a plurality of conductive layers 605 and a plurality of insulating layers separating each of the plurality of conductive layers 605. The hybrid circuit board 400 includes a board pocket 405 recessed within one or more of the plurality of conductive layers 605 and insulating layers of the hybrid circuit board 400. The board pocket 405, for example, can include a cut out of one or more of the plurality of conductive layers 605 and insulating layers at a portion of the hybrid circuit board 400.

The board pocket 405 includes one or more pocket shelves 525. The pocket shelves 525 can be disposed at an exterior edge of a respective board pocket 405. For example, the pocket shelves can include a ledge formed on the hybrid circuit board 400 by carving away, or not forming, such as when 3D printing, one of more layers of the hybrid circuit board 400.

Each pocket shelf 525 is disposed at a layer of the hybrid circuit board between the floor 610 of the board pocket 405 and the surface layer 615 of the hybrid circuit board 400. For instance, the pocket shelf 525 can be disposed at a particular conductive layer of the plurality of conductive layers 605 of the hybrid circuit board 400 to receive and/or transmit electrical signals from internal layers of the hybrid circuit board 400. For example, each pocket shelf 525 can include a plurality of I/O board connectors 520. The I/O board connectors 520 can include a plurality of circuit traces that can allow access to the particular conductive layer of the hybrid circuit board 400. A board pocket 405 can include a plurality of pocket shelves allowing access to one or more different layers of the hybrid circuit board 400.

FIG. 7 illustrates an example top view 700 of a portion of the hybrid circuit board 400 in accordance with one or more embodiments of the present disclosure. The hybrid circuit board 400 includes a plurality of conductive layers, a plurality of insulating layers separating each of the plurality of conductive layers, and the board pocket 405 recessed within one or more of the plurality of layers. The board pocket 405, for example, can include a cut out of one or more conductive layers 705 at a portion of the hybrid circuit board 400.

The board pocket 405 includes one or more pocket shelves 525, each corresponding to a particular layer of the hybrid circuit board 400. The pocket shelves 525 can include I/O board connectors 520. The I/O board connectors 520 can include one or more circuit traces of the hybrid circuit board 400. The circuit traces can be wire bonded by a conductive wire 715 to an I/O carrier connector 710 of an electrical pocket device disposed within the board pocket 405. The electrical pocket device, for example, can include a pocket circuit board including, for example, a die carrier assembly for an RF device. The I/O carrier connectors 710 for the electrical pocket device can include a capacitive pad associated with one or more I/O bits from an FPGA or microprocessor.

By way of example, the electrical pocket device can include I/O carrier connectors 710 associated with one or more control bits for phase shifting, attenuating, switching, or enabling. In addition, or alternatively, the I/O carrier connectors 710 can include voltage lines, bias lines, radio frequency lines, etc. For instance, the one or more capacitive pads can cover the one or more include voltage lines, bias lines, radio frequency lines, etc.

As described herein, conventional techniques for testing the electrical connectivity to an electrical component such a die carrier assembly can include placing a touch probe to an I/O carrier connector 710 (e.g., a capacitive pad, etc.) of the die carrier assembly after the assembly is electrically coupled to a PCB. This can lead to wasted resources for disassembling the PCB if a low or missing electrical connection is determined.

The non-contact testing techniques described herein can enable the testing of the I/O board connectors 520 before an electrical pocket device such as a die carrier assembly is placed within the board pocket 405. The hybrid circuit board 400 can include a plurality of board pockets 405. The connectivity of each of the I/O board connectors 520 in each board pocket 405 can be tested before an electrical pocket device is placed therein. In this manner, a I/O board connector 520 may be repaired to address a connectivity of the I/O board connector 520 before an electrical pocket device is installed and/or bonded to the I/O board connector 520.

By way of example, the circuit cover of the non-contact testing apparatus described herein can be removably placed over the board pocket 405 of the hybrid circuit board 400. The board pocket 405 can include a plurality of I/O board connectors 520 such as, for example, circuit traces disposed on pocket shelves 525 of the board pocket 405. Each circuit trace can be disposed at a respective layer of the hybrid circuit board 400. A circuit trace can be tested by placing the circuit cover of the non-contact testing apparatus over the board pocket 405. The non-contact testing apparatus can be configured to detect an electrical signal of the circuit trace by radiating the signal from the circuit cover. For instance, the circuit cover can include a conductive material that can be wirelessly excited (e.g., by forming a parallel plate capacitor) with a modulated signal (e.g., a fifty-megahertz signal, etc.) from the circuit trace.

The connectivity of a respective circuit trace disposed at the respective layer of the hybrid circuit board 400 can be tested by initiating an electrical signal through the respective circuit trace while the circuit cover is positioned over the board pocket 405. For instance, a respective bit associated with the circuit trace can be turned on at a threshold frequency to initiate a corresponding electrical signal through the circuit trace.

A respective electrical signal can be initiated, individually, for each circuit trace of the board pocket 405 to individually test the connectivity of each circuit trace. For instance, a respective bit corresponding to each circuit trace can be individually toggled on/off to individually test the connectivity of a corresponding circuit trace. In some embodiments, the electrical signal can include an electrical wave with a respective frequency. The electrical signal can include the same frequency for each circuit trace of the board pocket 405. The frequency can be based on a processor clock rate and/or a capacitance of a respective circuit trace/circuit cover. In some embodiments, the electrical signal can include a fifty-megahertz signal.

In some embodiments, the connectivity of at least two respective circuit traces of the plurality of circuit traces can be tested simultaneously by: (i) initiating a first electrical signal at a first frequency through a first circuit trace, and (ii) initiating a second electrical signal at a second frequency through a second circuit trace. The signals can include different frequencies to help simultaneously test the connectivity of at least two circuit traces.

The connectivity of each I/O board connector 520 of the hybrid circuit board 400 can be tested by placing the circuit cover of the non-contact testing apparatus over each board pocket 405 of the hybrid circuit board 400. In some embodiments, one circuit cover can be placed over multiple board pockets 405. In such a case, each of the I/O board connectors 520 for each of the covered board pockets can be individually tested without moving, such as without manually moving and/or without automatic robotically moving, the circuit cover over each individual board pocket of the hybrid circuit board 400.

Example Operations

FIG. 8 illustrates a flowchart according to an example method 800 for testing one or more electrical components of a circuit board in accordance with one or more embodiments of the present disclosure.

At step/operation 801, the method 800 can include injecting, via embedded software, a modulated signal. The embedded software, for example, can be programmed into an integrated circuit such as an FPGA and/or microprocessor.

At step/operation 802, the method 800 can include receiving, such as via a circuit cover placed over the electrical component, a coupled voltage signal corresponding to the electrical component. The circuit cover is separated from the electrical component by a dielectric or air. For instance, the circuit cover can be configured to form a parallel plate capacitor with the electrical component as described herein.

At step/operation 804, the method 800 can include measuring, such as via an oscilloscope probe, the coupled voltage signal. The coupled voltage signal can include a voltage across the parallel plate capacitor that can be received at the circuit cover. The received signal can be detected by the oscilloscope probe. The coupled voltage signal can be initiated by activating the electrical component. For example, the electrical component can include a circuit trace. An electrical signal can be initiated through the electrical component by initiating an electrical wave with a respective frequency through the circuit trace.

At step/operation 806, the method 800 can include outputting, such as via the oscilloscope probe and based on the coupled voltage signal, an indication of the connectivity of the electrical component. In some embodiments, the output can be amplified to a spectrum amplifier for easier determination of signal performance/presence. The method can include providing for display, via the spectrum analyzer, the indication of the connectivity of the electrical component.

At step/operation 808, the method 800 can include performing an action for the electrical component based on the indication of the connectivity of the electrical component. The repair action can include at least one of: (i) a verification of the performance of the portion of the electrical component, (ii) a modification to an integrated circuit corresponding to electrical component; and/or (iii) a repair of the electrical component.

The various operations described herein include use of a non-contact testing apparatus. In contrast to a contact testing apparatus of the prior art, which is described herein, the present invention allows for the wireless and contactless testing of electrical components that can be small, difficult to physically touch, and/or susceptible to degradation by physical touch. The present invention, as described herein, does not require making physical contact with an electrical component to test the connectivity of the component. This improves circuit testing operations, which is an improvement over contact circuit testing operations.

FIG. 9 illustrates a flowchart according to an example method 900 of manufacturing a hybrid circuit board in accordance with one or more embodiments of the present disclosure.

At step/operation 902, the method 900 can include forming a board pocket recessed within a plurality of circuit board layers comprising a plurality of conductive layers respectively separated by a plurality of insulating layers. The board pocket, for example, can be carved out from the plurality of board layers. In addition, or alternatively, the board pocket can be formed during the manufacturing of the plurality of board layers by not forming a layer, such as when 3D printing, at a respective position of the hybrid circuit board.

At step/operation 904, the method 900 can include affixing one or more electrical pocket devices to a floor of the board pocket. The one or more electrical pocket devices can include a die carrier assembly comprising one or more capacitive pads. The die carrier assembly can be placed within the board pocket and/or attached to the floor of the board pocket using one or more electrical adhesives.

At step/operation 906, the method 900 can include forming one or more pocket shelves at an exterior edge of the board pocket and an intermediate board layer positioned between the floor of the board pocket and a surface layer of the plurality of board layers. The one or more pocket shelves, for example, can be carved out from the plurality of board layers. In addition, or alternatively, the one or more pocket shelves can be formed during the manufacturing of the plurality of board layers by not forming a layer, such as when 3D printing, at a respective position of the hybrid circuit board.

At step/operation 908, the method 900 can include electrically coupling the one or more electrical pocket devices to one or more intermediate layers of the plurality of board layers. The one or more electrical pocket devices can be electrically coupled to the one or more intermediate layers of the plurality of board layers by wire-bonding the one or more capacitive pads to the one or more intermediate layers of the plurality of board layers. In some embodiments, the one or more capacitive pads can be wire-bonded to one or more circuit traces of the intermediate board layer.

While this specification contains many specific embodiment and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are illustrated in the drawings in a particular order, this should not be understood as requiring that such operations be performed in the particular order shown or in sequential order, or that all illustrated operations be performed, to achieve desirable results. In certain circumstances, operations in alternative ordering may be advantageous. In some cases, the actions recited in the claims may be performed in a different order and still achieve desirable results.

Thus, while particular embodiments of the subject matter have been described, other embodiments are within the scope of the following claims.

The invention claimed is:

1. A hybrid circuit board comprising:
a plurality of board layers comprising a plurality of conductive layers respectively separated by a plurality of insulating layers, wherein the plurality of board layers comprises a surface layer and digital circuitry is at least partially disposed at the surface layer;
a plurality of board pockets recessed within the plurality of board layers, wherein a board pocket comprises a floor at a first intermediate board layer of the plurality of board layers; and
one or more electrical pocket devices disposed on the floor of the board pocket, wherein the one or more electrical pocket devices comprise radio frequency (RF) circuitry that is at least partially disposed within the board pocket and electrically coupled to an intermediate board layer between the first intermediate board layer and the surface layer.

2. The hybrid circuit board of claim 1, further comprising:
a plurality of surface-mount devices disposed on one or more top board layers of the plurality of board layers, wherein the one or more top board layers are separated from the first intermediate board layer by one or more intermediate insulating layers of the plurality of insulating layers.

3. The hybrid circuit board of claim 2, wherein the plurality of surface-mount devices comprises the digital circuitry that is insulated from the RF circuitry by the one or more intermediate insulating layers.

4. The hybrid circuit board of claim 1, further comprising:
a pocket lid comprises an insulating material that is disposed over and at partially covers an opening of the board pocket at the surface layer of the plurality of board layers.

5. The hybrid circuit board of claim 1, wherein the hybrid circuit board comprises one or more pocket shelves respectively disposed at an exterior edge of the board pocket, wherein a pocket shelf is disposed at the intermediate board layer positioned between the first intermediate board layer and the surface layer of the plurality of board layers.

6. The hybrid circuit board of claim 5, wherein the pocket shelf comprises one or more I/O board connectors for electrically coupling at least a portion of the one or more electrical pocket devices to the intermediate board layer.

7. The hybrid circuit board of claim 6, wherein the one or more electrical pocket devices comprise one or more input/output (I/O) carrier components that are electrically coupled to the one or more I/O board connectors.

8. The hybrid circuit board of claim 5, wherein the pocket shelf comprises a plurality of pocket circuit traces for electrically coupling the one or more electrical pocket devices to the intermediate board layer.

9. The hybrid circuit board of claim 8, wherein the one or more electrical pocket devices comprise a die carrier assembly comprising one or more input/output (I/O) carrier components.

10. The hybrid circuit board of claim 9, wherein the one or more I/O carrier components comprise one or more capacitive pads associated with one or more control bits of a surface mounted field programmable gate array (FPGA).

11. The hybrid circuit board of claim 10, wherein the one or more control bits of the FPGA comprise one or more control bits for phase shifting or attenuation of an antenna.

12. The hybrid circuit board of claim 10, wherein the one or more capacitive pads cover one or more voltage lines, bias lines, or RF lines of the die carrier assembly.

13. The hybrid circuit board of claim 10, wherein the one or more capacitive pads are wire bonded to the plurality of pocket circuit traces to electrically couple the die carrier assembly to the intermediate board layer.

14. The hybrid circuit board of claim 8, wherein the plurality of pocket circuit traces comprise one or more voltage or control lines of the intermediate board layer.

15. An antenna controller apparatus that integrates digital control signals with radio frequency (RF) signals, comprising:
a hybrid circuit board comprising:
(i) a plurality of board layers comprising a plurality of conductive layers respectively separated by a plurality of insulating layers; and
(ii) a plurality of board pockets recessed within the plurality of board layers, wherein a board pocket comprises a floor at a first intermediate board layer of the plurality of board layers;
digital circuitry at least partially disposed at one or more surface layers of the hybrid circuit board; and
RF circuitry at least partially disposed within the plurality of board pockets and electrically coupled to one or more intermediate board layers between the first intermediate board layer and the one or more surface layers of the hybrid circuit board.

16. The antenna controller apparatus of claim 15, wherein the hybrid circuit board is a receiver or a transmitter column associated with an antenna array system.

17. A method of manufacturing a hybrid circuit board, comprising:
forming a board pocket recessed within a plurality of board layers comprising a plurality of conductive layers respectively separated by a plurality of insulating layers;
affixing one or more electrical pocket devices that comprise a die carrier assembly with a capacitive pad to a floor of the board pocket; and
wire-bonding the capacitive pad to an intermediate board layer of the plurality of board layers.

18. The method of manufacturing the hybrid circuit board of claim 17, further comprising:
forming one or more pocket shelves at an exterior edge of the board pocket and the intermediate board layer positioned between the floor of the board pocket and a surface layer of the plurality of board layers; and
wire-bonding the capacitive pad to one or more circuit traces of the intermediate board layer.

* * * * *

UNITED STATES PATENT AND TRADEMARK OFFICE
CERTIFICATE OF CORRECTION

PATENT NO. : 12,282,053 B1
APPLICATION NO. : 18/045299
DATED : April 22, 2025
INVENTOR(S) : Mark Bates et al.

Page 1 of 1

It is certified that error appears in the above-identified patent and that said Letters Patent is hereby corrected as shown below:

On the Title Page

In Column 2, item (57), Abstract, Line 7, delete "is places" and insert -- is placed --, therefor.

Signed and Sealed this
Sixteenth Day of September, 2025

Coke Morgan Stewart
*Acting Director of the United States Patent and Trademark Office*